United States Patent [19]

De Gennaro

[11] 4,087,737
[45] May 2, 1978

[54] PHASE SHIFTING CIRCUIT

[75] Inventor: Cosmo Henry De Gennaro, Morris Plains, N.J.

[73] Assignee: Bell Telephone Laboratories, Incorporated, Murray Hill, N.J.

[21] Appl. No.: 788,139

[22] Filed: Apr. 18, 1977

[51] Int. Cl.² ............................................. H03F 1/34
[52] U.S. Cl. .................................. 323/108; 307/232; 307/262; 323/122; 328/155; 330/107
[58] Field of Search ................. 323/108, 121, 122, 34; 328/155; 330/107, 109, 294; 307/262, 232

[56] References Cited

U.S. PATENT DOCUMENTS

| | | | |
|---|---|---|---|
| 3,378,785 | 4/1968 | Nordahl | 323/108 |
| 3,465,276 | 9/1969 | Silva et al. | 328/155 |
| 3,566,284 | 2/1971 | Thelen | 328/155 |
| 3,943,455 | 3/1976 | Bladen | 307/262 |
| 4,015,224 | 3/1977 | Benzinger | 330/107 |

OTHER PUBLICATIONS

*Handbook of Op. Amp. Applications,* 1963, Burr-Brown, Research Corp. pp. 16 & 52, relied upon.

*Primary Examiner*—Gerald Goldberg
*Attorney, Agent, or Firm*—Hugh Linton Logan

[57] ABSTRACT

A phase shifting circuit of the type comprising an operational amplifier with a capacitor in its negative feedback path and a resistor in series with its inverting input port is modified to provide adjustable phase shift. Adjustability is achieved by connecting a second capacitor in shunt with the resistor and, furthermore, a series-connected third capacitor and signal-inverting, controllable-gain amplifier also in shunt with the resistor.

4 Claims, 4 Drawing Figures

PHASE SHIFTING CIRCUIT

BACKGROUND OF THE INVENTION

1. Field of the Invention

This invention relates to phase shifters and in particular to phase shifters whose shifting characteristics may be controlled.

2. Description of the Prior Art

One known type of phase shifter takes the form of an integrator circuit comprising an operational amplifier having a capacitor connected in series between its output and inverting input ports and a resistor connected between an input terminal and the inverting input port. With an ideal operational amplifier (i.e. one with infinite gain and infinite input impedance), this type of phase shifter provides, at all frequencies, exactly ninety degrees of phase shift between the input terminal and the output port. Although commercially available operational amplifiers do not have these ideal characteristics, they do exhibit characteristics which result in substantially ninety degree phase shifts over relatively wide frequency ranges.

SUMMARY OF THE INVENTION

An object of the present invention is to make the phase shift introduced by an integrator type of phase shifter controllable so that the frequency range over which a ninety degree shift is obtainable is increased and, furthermore, so that phase shifts of other than ninety degrees can be achieved.

This and other objects of the invention are achieved by adding a controllable network in shunt with the resistor of an operational amplifier integrating circuit. This network takes the form of a parallel circuit having a first capacitor connected in series in one branch and a signal-inverting, controllable-gain amplifier and a second capacitor connected in series in a second branch. The first capacitor branch presents a conventional capacitive reactance value while the second capacitor branch presents a conventional capacitor reactance value but with the sign reversed to reflect the effect of the inverting amplifier.

In operation, there is one particular gain setting of the inverting amplifier where the second capacitor branch effect just cancels the effect produced by the first capacitor branch and the network appears to have an infinite impedance. When the gain is decreased, the network presents a normal capacitance reactance whose value is related to the gain setting. On the other hand, when the gain setting is increased, the network presents a normal capacitance reactance whose value is related to the gain setting but with the sign reversed. As discussed in detail in the following discussion, the net effect on the integrating circuit when it is used as a phase shifter is to permit the phase shift to be held to a particular value in a range including the normal ninety degree shift provided by the integrating circuit.

DETAILED DESCRIPTION

Figure 1:
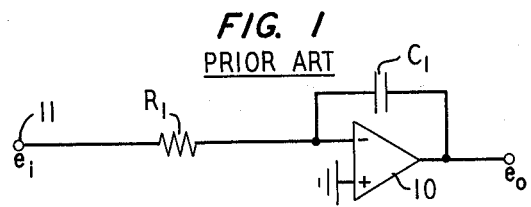
FIG. 1 shows a prior art operational amplifier integrating circuit which may be used as a phase shifter.

FIG. 1 shows the principal components of a prior art integrating circuit which may be used for phase shifting. The circuit comprises an operational amplifier 10 with a feedback capacitor $C_1$ connected between its output and inverting input ports and a resistor $R_1$ connected between an input terminal 11 and the amplifier inverting input port. Operational amplifiers have such extremely high open circuit gains and input impedances that they may both be assumed to be infinite in general network design. With these assumptions, the inverting and non-inverting input ports of the amplifier are at the same potential, all of the current through resistor $R_1$ flows into capacitor $C_1$, and an input signal $e_i$ is related to a resulting output signal $e_o$ in the following manner:

$$e_o = j \frac{1}{\omega R_1 C_1} e_i \quad (1)$$

From equation (1), it is seen that the two signals are displaced from one another by ninety degrees. In actual practice, phase shifts within a fraction of a degree of ninety degrees are achieved.

Figure 2:
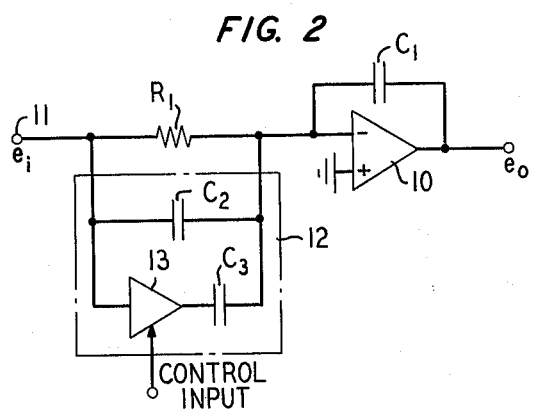
FIG. 2 shows one embodiment of the invention.

An embodiment of the invention is disclosed in FIG. 2. In FIG. 2, a network 12 is connected in shunt with resistor $R_1$ of the circuit of FIG. 1. The network is in the form of a parallel circuit with a capacitor $C_2$ connected in series in one branch and a capacitor $C_3$ and a signal-inverting, controllable-gain amplifier 13 connected in series in the other branch. The output signal $e_o$ to input signal $e_i$ relationship is:

$$e_o = \left( j \frac{1}{\omega C_1} \right) \left( \frac{e_i}{R_1} - \frac{e_i}{j/\omega C_2} + \frac{Ge_i}{j/\omega C_3} \right) e_i \quad (2)$$

where G is the gain of amplifier 13 and the sign of the last term is positive because amplifier 13 produces 180° of phase shift. This equation may be simplified to produce $$e_o = \left( j \frac{1}{\omega R_1 C_1} - \frac{C_2}{C_1} + \frac{GC_3}{C_1} \right) e_i \quad (3)$$

An examination of equation (3) discloses:

(1) When $GC_3 = C_2$, network 12 has an infinite impedance effect and the circuit phase shift is substantially equal to 90°;

(2) When $GC_3 < C_2$, network 12 causes equation (3) to have a negative real value and the circuit phase shift is greater than 90° by an amount related to the difference between $GC_3$ and $C_2$; and (3) When $GC_3 > C_2$, network 12 causes equation (3) to have a positive real value and the circuit phase shift is less than 90° by an amount related to the difference between $GC_3$ and $C_2$.

Figure 3:
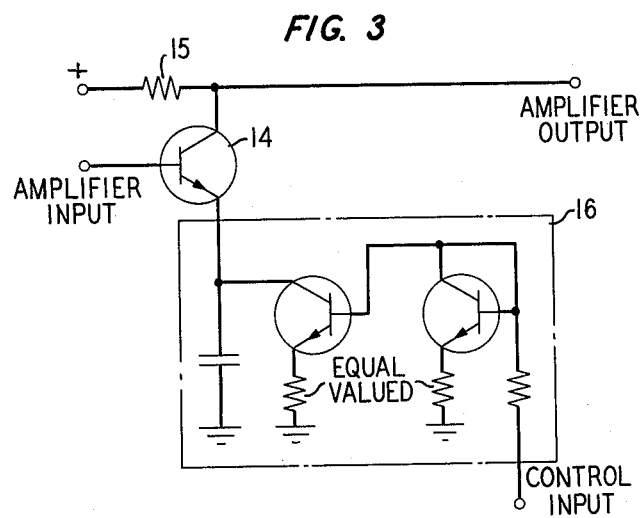
FIG. 3 shows a schematic diagram of a signal-inverting, controllable-gain amplifier which may be used when practicing the invention.

FIG. 3 shows a signal-inverting, controllable-gain amplifier which may be used in practicing the invention. This amplifier comprises a transistor 14, a collector resistor 15 and a bias setting circuit 16 which sets the bias in response to a control input voltage. Other amplifiers may, of course, also be used.

Figure 4:
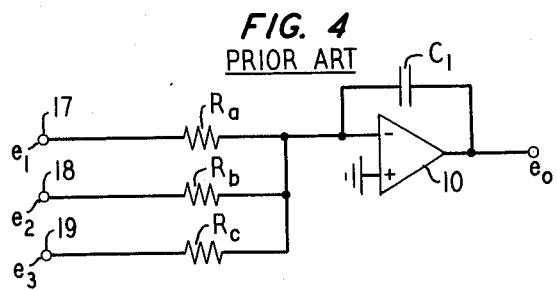
FIG. 4 shows a prior art summing integrating circuit which also utilizes an operational amplifier.

FIG. 4 shows a prior art summing integrating circuit which offers another viewpoint with respect to the invention. When a common input signal is applied to all three input terminals 17, 18 and 19, an output versus input phase shift of 90° is produced as in the circuit of FIG. 1. However, when the components $R_b$ and $R_c$ are changed in accordance with the teachings of the present invention, a controllable phase shift circuit identical to that disclosed in FIG. 2 is produced.

What is claimed is:

1. In a phase shifting circuit of the integrating circuit type comprising an operational amplifier having a capacitor connected between its output and inverting input ports and a resistor connected between an input terminal and said inverting input port, an improvement characterized in that,
   a parallel network is connected in shunt with said resistor, wherein said network comprises a first capacitor connected in series in one branch and a signal-inverting, controllable-gain amplifier and a second capacitor connected in series in a second branch.

2. In a phase shifting circuit of the integrating circuit type comprising an operational amplifier having a capacitor connected between its output and inverting input ports and a resistor connected between an input terminal and said inverting input port, an improvement characterized in that,
   a capacitor is connected in shunt with said resistor, and
   a series-connected capacitor and signal-inverting, controllable-gain amplifier are also connected in shunt with said resistor.

3. In a summing network comprising an operational amplifier having a capacitor connected between the output and inverting input ports of said operational amplifier, and first, second and third impedance paths connected between first, second and third terminals, respectively, and said inverting input port, an improvement characterized in that,
   said first path comprises a series-connected resistor,
   said second path comprises a series-connected capacitor,
   said third path comprises a signal-inverting, controllable-gain amplifier and a capacitor connected in series, and
   said first, second and third terminals are connected together to form a common input terminal.

4. A phase shifting circuit comprising
   an operational amplifier having an inverting input port and an output port,
   a first capacitor connected in series between said amplifier inverting input and output ports,
   a circuit input terminal,
   a resistor connected in series between said circuit input terminal and said amplifier inverting input port,
   a second capacitor connected in series between said circuit input terminal and said amplifier inverting input port,
   a signal-inverting, controllable-gain amplifier,
   a third capacitor, and
   means connecting said signal-inverting, controllable-gain amplifier and said third capacitor in series between said circuit input terminal and said operational amplifier inverting input port.

* * * * *